US011605534B2

(12) United States Patent
Chou et al.

(10) Patent No.: US 11,605,534 B2
(45) Date of Patent: Mar. 14, 2023

(54) PARTICLE PREVENTION IN WAFER EDGE TRIMMING

(71) Applicant: Taiwan Semiconductor Manufacturing Company, Ltd., Hsin-Chu (TW)

(72) Inventors: Tung-He Chou, Hsinchu (TW); Sheng-Chau Chen, Tainan (TW); Ming-Tung Wu, Hsinchu (TW); Hsun-Chung Kuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1 day.

(21) Appl. No.: 17/371,577

(22) Filed: Jul. 9, 2021

(65) Prior Publication Data
US 2021/0335602 A1    Oct. 28, 2021

Related U.S. Application Data

(62) Division of application No. 16/534,310, filed on Aug. 7, 2019, now Pat. No. 11,081,334.

(51) Int. Cl.
*H01L 21/02* (2006.01)
*B08B 5/02* (2006.01)
(Continued)

(52) U.S. Cl.
CPC .......... *H01L 21/02087* (2013.01); *B08B 3/10* (2013.01); *B08B 5/02* (2013.01); *H01L 21/67051* (2013.01); *H01L 21/68764* (2013.01)

(58) Field of Classification Search
None
See application file for complete search history.

(56) References Cited

U.S. PATENT DOCUMENTS

| 10,199,216 B2 | 2/2019 | Ostermaier et al. |
| 2008/0006302 A1* | 1/2008 | Araki ............... H01L 21/67028 134/94.1 |

(Continued)

OTHER PUBLICATIONS

Disco Coporation. "Cyclical Surface Chipping—Part 2." The Cutting Edge Technical Newsletter, published in 2000.
(Continued)

*Primary Examiner* — Cristi J Tate-Sims
(74) *Attorney, Agent, or Firm* — Eschweiler & Potashnik, LLC

(57) ABSTRACT

In some embodiments, the present disclosure relates to method for trimming and cleaning an edge of a wafer. The method includes trimming an outer edge portion of the wafer with a blade along a continuously connected trim path to define a new sidewall of the wafer. The trimming produces contaminant particles on the wafer. Further, the method includes applying deionized water to the new sidewall of the wafer with water nozzles to remove the contaminant particles. The method also includes applying pressurized gas to the wafer at a first top surface area of the wafer with an air jet nozzle. The pressurized gas is directed outward from a center of the wafer to remove remaining contaminant particles. The applying of deionized water and the applying of pressurized gas are performed in a same chamber as the trimming.

20 Claims, 10 Drawing Sheets

(51) Int. Cl.
*H01L 21/687* (2006.01)
*H01L 21/67* (2006.01)
*B08B 3/10* (2006.01)

(56) References Cited

U.S. PATENT DOCUMENTS

| | | |
|---|---|---|
| 2008/0213978 A1 | 9/2008 | Henry et al. |
| 2009/0081810 A1 | 3/2009 | Hamada et al. |
| 2016/0240413 A1 | 8/2016 | Kobayashi et al. |
| 2018/0229396 A1* | 8/2018 | Sekiya ............. B28D 5/0005 |

OTHER PUBLICATIONS

Disco Coporation "Backside Chipping—Part 3: Workpiece Related Factors" The Cutting Edge Technical Newsletter, published in 2003.

Bruecker et al. "The multi-scale nature of Wall shear stress fluctuations in turbulent Rayleigh-Benard convection." City, University of London Institutional Repository, published on Jan. 23, 2019.

DiC Corporation. "eFLOW Series Antistatic Device for Ultra-pure Water." The date of publication is unknown. Retrieved online on Apr. 11, 2019 from http://www.dic-global.com/en/products/membrane/eflow/.

Gale et al. "Aqueous Cleaning and Surface Conditioning Processes." Published Mar. 2018.

Sethu, R. S. 2012, "Reducing non-stick on pad for wire bond: A review", Australian Journal of Mechanical Engineering, vol. 9, No. 2, pp. 147-160, http://dx.doi.org/10.7158/M11-771.2012.9.2. Published in 2012.

Applied Surface Technologies. "Carbon Dioxide Snow Cleaning." Published in 2016.

Vos et al. "Removal of Submicrometer Particles from Silicon Wafer Surfaces Using HF-Based Cleaning Mixtures." Journal of The Electrochemical Society, 148 (12) G683-G691 (2001), published on Oct. 25, 2001.

Min-Su Kim, Taesung Kim & Jin-Goo Park (2015) Removal of Nano-sized Particles Using Carbon Dioxide (CO2) Gas Cluster Cleaning without Pattern Damage, Particulate Science and Technology, 33:5, 558-561, DOI: 10.1080/02726351.2015.1060651, published on Aug. 11, 2015.

Chaplin, Martin. "Nanobubbles (Ultrafine Bubbles)." Published on Apr. 6, 2019.

Wikipedia.org "Propellant" Published on Nov. 4, 2018.

Zhu et al. "Cleaning with Bulk Nanobubbles." The American Chemical Society, 2016, 32, 11203-11211, published on Apr. 23, 2016.

Non-Final Office Action dated Sep. 17, 2020 for U.S. Appl. No. 16/534,310.

Notice of Allowance dated Apr. 2, 2021 for U.S. Appl. No. 16/534,310.

* cited by examiner

PARTICLE PREVENTION IN WAFER EDGE TRIMMING

REFERENCE TO RELATED APPLICATION

This Applications is a Divisional of U.S. application Ser. No. 16/534,310, filed on Aug. 7, 2019, the contents of which are hereby incorporated by reference in their entirety.

BACKGROUND

Semiconductor device fabrication is a process used to create integrated circuits that are present in everyday electronic devices. The fabrication process is a multiple-step sequence of photolithographic and chemical processing steps during which electronic circuits are gradually created on a wafer composed of a semiconducting material. During fabrication, the edge of the wafer may become damaged or otherwise unsuitable for use with electronic circuits. Hence, the edge of the wafer may be trimmed during fabrication. During wafer edge trimming, contaminant particles may be present. Cleaning processes are used to remove the contaminant particles from wafer edge trimming to produce reliable semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
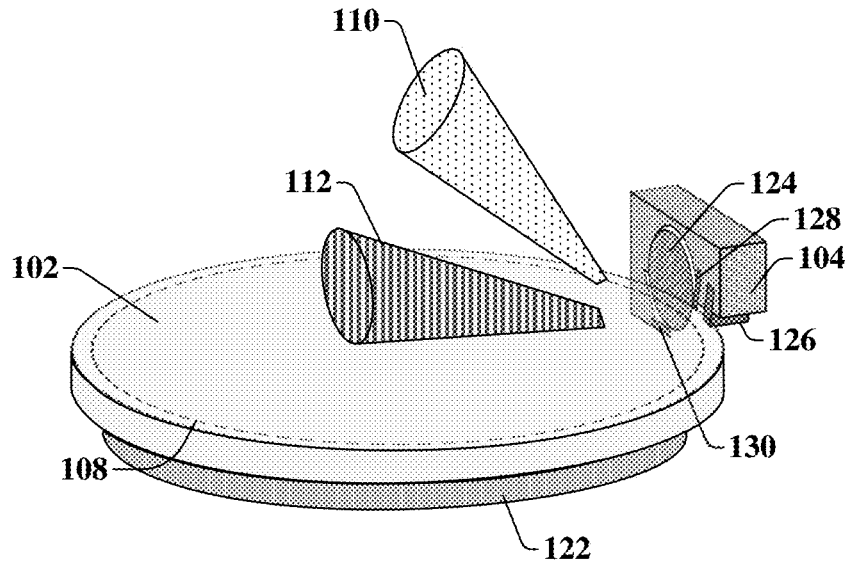
FIGS. 1A, 1B, and 1C illustrate a perspective view, a cross-sectional view, and a top-view, respectively, of a wafer trimming and cleaning apparatus comprising a solution nozzle and an air jet nozzle.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor device fabrication, integrated circuits may be formed on a wafer made of a semiconductor material. In some fabrication methods, edges of the wafer become damaged or are unreliable during fabrication, and thus are removed. For example, in some embodiments, the wafer may be warped at its edges. In other embodiments, multiple wafers and/or layers are stacked upon and bonded to one another, and at the edges of the stack, the bonding may be weak. Even further, in some embodiments, robots may contact the wafer at the edges for transportation, causing damage.

A method for removing damaged edges of a wafer may, for example, include placing the wafer on a wafer chuck and continuously trimming off the damaged wafer edges using a blade apparatus. The blade apparatus may include a spinning blade and multiple water nozzles. As the blade trims off the damaged wafer edges, contaminant particles may be left behind on the trimmed wafer edge. The multiple water nozzles apply deionized water to the trimmed wafer edge as the blade is trimming in order to clean the wafer by removing the contaminant particles. However, the contaminant particles may be very small, and difficult to remove. For example, the contaminant particles may get trapped in different crevices on the wafer edge, and also within the wafer and/or the integrated circuits that may be present on a top surface of the wafer. In some embodiments, the deionized water applied by the multiple water nozzles is localized to the trimmed wafer edge and a small portion of the top surface of the wafer adjacent to the trimmed wafer edge. Oftentimes, contaminant particles still remain on the top surface of the wafer, and a mixture of the contaminant particles and deionized water may flow towards the center of the wafer instead of off of the top surface of the wafer. Also, in some embodiments, the deionized water may not be effective to remove such small contaminant particles. Further, the contaminant particles may comprise different materials and thus, have different types of attractive forces that keep the contaminant particles on the wafer surface. For example, in some embodiments, the contaminant particles may comprise a semiconductor material (e.g., silicon, germanium, etc.), an oxide (e.g., silicon oxide, silicon oxynitride, etc.), a metal (e.g., copper, aluminum, tungsten, etc.), or a combination thereof. Thus, in some embodiments, the semiconductor device may still be damaged and unreliable after wafer edge trimming due to the presence of contaminant particles.

Various embodiments of the present disclosure provide wafer trimming and cleaning apparatuses and methods for trimming and cleaning a wafer to remove damaged edges and still produce reliable electronic devices. In some embodiments, the apparatus includes a blade, water nozzles, a solution nozzle, and an air jet nozzle. The blade is configured to trim off the damaged edges to define a new sidewall, and the aforementioned nozzles are configured to clean the wafer by removing any contaminant particles as the blade is trimming; thus, the trimming and cleaning are performed in-situ. The water nozzles are configured to remove contaminant particles present on the new sidewall of the wafer by applying deionized water to the new edge. However, contaminant particles may be present on a top surface of the wafer. Therefore, the solution nozzle is configured to clean a first top surface area of the wafer that is adjacent to the new sidewall of the wafer. In other words, the first top surface area has an edge that intersects with the new sidewall of the wafer. The solution nozzle is configured to apply a cleaning solution to the first top surface area that removes the contaminant particles off of the wafer. The cleaning solution may comprise a surfactant, a solution of deionized water and nanobubbles, or another cleaning chemical. The cleaning solution has properties that effectively remove the contaminant particles that are attracted to the wafer. However, still, contaminant particles and/or the cleaning solution may be present on the top surface of the wafer. For example, some contaminant particles still may be in crevices on the wafer, or the cleaning solution may have not fully forced the contaminant particles off of the wafer. Thus, the air jet nozzle is configured to then clean a second top surface area of the wafer, which includes the first top surface area, by applying a pressurized gas to the wafer, to agitate, dislodge and push off any remaining contaminant particles and/or solutions.

The aforementioned method produces reliable devices (e.g., devices having a high wafer acceptance test performance) for many reasons. For example, by performing the trimming and cleaning steps in-situ, the method is efficient and does not add extra time to the fabrication process. Additionally, the method provides up to three cleaning nozzles that utilize different solutions, which provides a variety of different properties/scientific principles to effectively remove contaminant particles that may be different from one another in size, in material, and in location on the wafer.

FIG. 1A illustrates a perspective view 100A of some embodiments of a wafer trimming and cleaning apparatus comprising a solution nozzle and an air jet nozzle.

The wafer trimming and cleaning apparatus includes a blade apparatus 104 which structurally supports a blade 124, a spray nozzle 126, a shower nozzle 128, and a blade cooler nozzle 130. A wafer chuck 122 is disposed beneath the blade apparatus 104 and is configured to hold a wafer 102. The wafer 102 is illustrated as transparent such that the blade apparatus 104 is still visible. The blade 124 is configured to trim an outer edge of the wafer 102 along a trim path 108. As the blade 124 rotates and trims the wafer 102 along the trim path 108, damaged edge portions of the wafer 102 are removed and undamaged edge portions of the wafer 102 remain. The blade cooler nozzle 130 is configured to apply deionized water to the blade 124 as it is rotating and trimming the wafer 102 to avoid heat damage to the wafer 102 and/or the blade 124. The spray nozzle 126 and the shower nozzle 128 also apply deionized water to the blade 124 and the wafer 102 to aid in performing a clean cut to the wafer 102 along the trim path 108. Together, the spray nozzle 126, the shower nozzle 128, and the blade cooler nozzle 130 may be labeled as the water nozzles of the blade apparatus 104. In some embodiments, the spray nozzle 126 and/or the shower nozzle 128 direct the deionized water to the new sidewall of the wafer 102 after trimming to remove any contaminant particles from the new sidewall of the wafer 102 generated from the blade 124 during trimming. The spray nozzle 126 and/or the shower nozzle 128 may also direct the deionized water to a first top surface area of the wafer 102, wherein the first top surface area of the wafer 102 shares an edge with the new sidewall of the wafer 102 to remove any contaminant particles from the first top surface area of the wafer 102.

In some embodiments, the wafer trimming and cleaning apparatus further includes a solution nozzle 110. The solution nozzle 110 is configured to direct a cleaning solution onto a second top surface area of the wafer 102 to remove any contaminant particles that were not removed by the spray nozzle 126 and/or the shower nozzle 128. In some embodiments, the spray nozzle 126 and/or the shower nozzle 128 cause contaminant particles and/or deionized water to be in the second top surface area of the wafer 102 and are ineffective in removing the contaminant particles and/or deionized water from the second top surface area of the wafer 102. The solution nozzle 110 is arranged such that the cleaning solution is directed away from a center of the wafer 102 and towards the blade apparatus 104 to dislodge and force the contaminant particles off of the wafer 102. Further, the cleaning solution has different contaminant particle removal techniques than deionized water used by the spray nozzle 126 and the shower nozzle 128. For example, in some embodiments, the cleaning solution applied by the solution nozzle 110 may comprise nanobubbles distributed throughout deionized water or some other liquid solution. A nanobubble is a bubble (e.g., gas) within a solution that has a diameter less than 1 micrometer. In some embodiments, a nanobubble has a diameter of, for example, approximately 100 nanometers. In some embodiments, the nanobubbles may provide, for example, more agitation to dislodge contaminant particles than a solution without nanobubbles. In some embodiments, the interface of the nanobubbles and deionized water may have a higher energy than the interface of the contaminants and the wafer 102, which aids in removing the contaminant particles from the wafer. In other embodiments, the cleaning solution applied by the solution nozzle 110 comprise a surfactant, which may, for example, break the attractive forces between the contaminant particles and the wafer 102 and further remove contaminant particles from the wafer 102 without redeposition.

In some embodiments, the wafer trimming and cleaning apparatus further includes an air jet nozzle 112. The air jet nozzle 112 is configured to apply a pressurized gas onto a third top surface area of the wafer 102 to remove any remaining contaminant particles. The third top surface area of the wafer 102 includes the first and second top surface areas. Thus, the air jet nozzle 112 is arranged to clean a larger top surface area of the wafer 102 than the solution nozzle 110 and the blade apparatus 104, and the air jet nozzle 112 is arranged to utilize a planar flow to dislodge any remaining contaminant particles, cleaning solutions, and deionized water away from the center of the wafer 102 and towards the blade 124.

Thus, the wafer trimming and cleaning apparatus of FIG. 1A utilizes the blade 124, the water nozzles (the spray nozzle 126, the shower nozzle 128, and the blade cooler nozzle 130), the solution nozzle 110, and the air jet nozzle 112 to trim a damaged edge portion of the wafer 102 and subsequently clean the nearby undamaged edge portion of the wafer 102 by removing contaminant particles generated by trimming. The wafer and cleaning apparatus is configured to conduct the cleaning in the same chamber (e.g., in-situ) with the trimming such that no time is added to the manufacturing process.

Figure 1B:
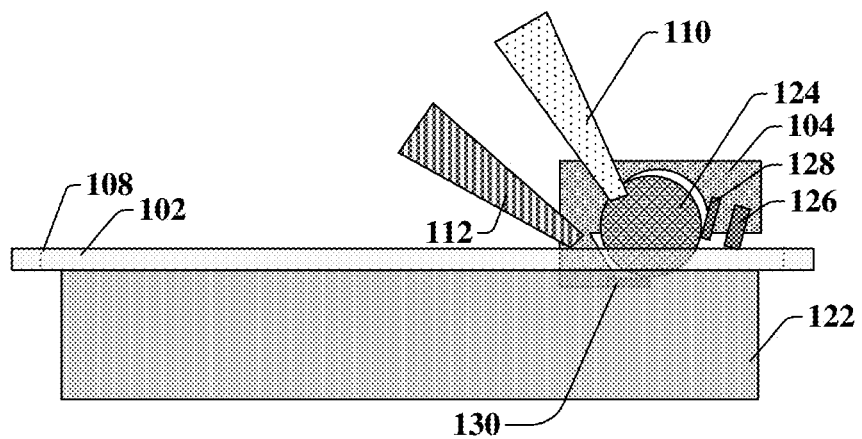

FIG. 1B illustrates a cross-sectional view 100B of some embodiments of the wafer trimming and cleaning apparatus of FIG. 1A.

The cross-sectional view 100B of FIG. 1B includes the same features as and corresponds to the perspective view 100A of FIG. 1A. The wafer 102 is illustrated as transparent such that the blade apparatus 104 is still visible. In some embodiments, the blade 124 has a lowest surface that is below a lowest surface of the wafer 102 such that the blade 124 completely cuts through the wafer 102. Further, in some embodiments, the wafer chuck 122 is configured to have a diameter that is smaller than the diameter of the wafer 102, such that the wafer chuck 122 does not interfere with the blade 124. Similarly, the wafer chuck 122 is configured to have a diameter that is smaller than the trim path 108 of the wafer 102, such that the wafer chuck 122 does not interfere with the blade 124. Thus, in some embodiments, the blade apparatus 104 does not directly overlie the wafer chuck 122 (see, the perspective view 100A of FIG. 1A). In some embodiments, the solution nozzle 110 and the air jet nozzle 112 do directly overlie the wafer chuck 122. In other embodiments, the solution nozzle 110 and the air jet nozzle 112 directly overlie the wafer 102 but not the wafer chuck 122. Further, in some embodiments, the wafer 102 comprises a stack of multiple wafers bonded to one another. Thus, the blade 124 may have a lowest surface that is below a lowest surface of the stack of multiple wafers bonded to one another.

Figure 1C:
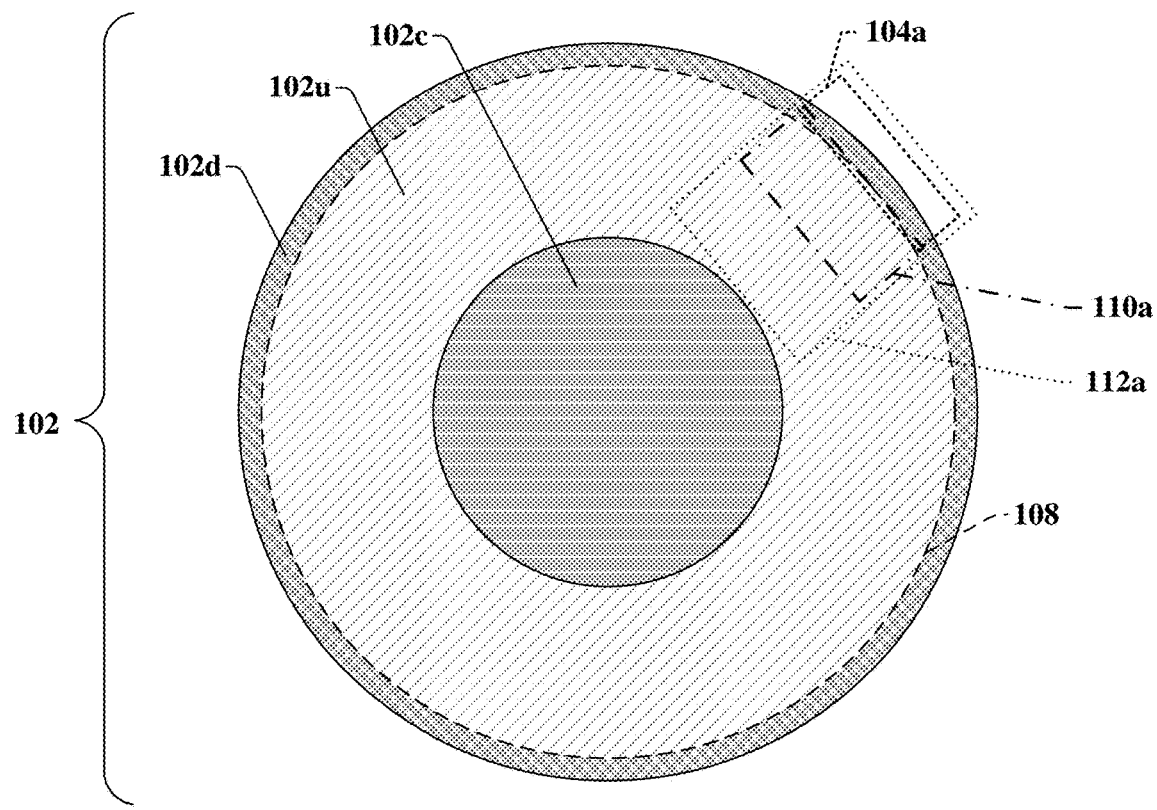

FIG. 1C illustrates a top-view 100C of some embodiments of a wafer having a damaged edge portion corresponding to the perspective view 100A of FIG. 1A.

The top-view 100C of FIG. 1C includes some additional features of the wafer 102 of FIGS. 1A and 1B. In some embodiments, the wafer 102 comprises a damaged edge portion 102d surrounding an undamaged edge portion 102u and a central portion 102c. The damaged edge portion 102d may comprise damaged areas such as warped regions, non-bonded regions, or pinched regions, making the damaged edge portion 102d unsuitable for electronic devices. The damaged edge portion 102d and the undamaged edge portion 102u may, in some embodiments, each be ring shaped. The undamaged edge portion 102u may separate the damaged edge portion 102d from the central portion 102c. Further, in some embodiments, an interface between the damaged edge portion 102d and the undamaged edge portion 102u may define the trim path 108. In other embodiments, the trim path 108 may intersect the undamaged edge portion 102u, such that the damaged edge portion 102d and an outer area of the undamaged edge portion 102u are removed during trimming, while majority of the undamaged edge portion 102u is not removed from the wafer 102.

In some embodiments, from the top-view 100C, the blade apparatus (104 of FIG. 1A) has a first spray area 104a and is configured to apply deionized water to the wafer 102 at the first spray area 104a. The first spray area 104a moves with the blade apparatus (104 of FIG. 1A) and may, for example, be the same as, include, or otherwise correspond to a first top surface area of the wafer 102 that is cleaned by the blade apparatus (104 of FIG. 1A). In some embodiments, an outline of the first spray area 104a is the same as that of the first top surface area. As the blade apparatus moves (104 of FIG. 1A), the first spray area 104a overlaps with the damaged edge portion 102d at a location ahead of the blade (124 of FIG. 1A) and overlaps with the new sidewall at a location behind the blade (124 of FIG. 1A). Hence, the blade apparatus (104 of FIG. 1A) may clean the new sidewall as the blade apparatus (104 of FIG. 1A) moves. The deionized water may be applied by the spray nozzle (126 of FIG. 1A) and/or the shower nozzle (128 of FIG. 1A) to the new sidewall of the wafer 102. In some embodiments, the first spray area 104a also overlaps the undamaged edge portion 102u.

In some embodiments, the solution nozzle (110 of FIG. 1A) has a second spray area 110a and is configured to apply the cleaning solution to the wafer at the second spray area 110a. The second spray area 110a moves with the blade apparatus (104 of FIG. 1A) and may, for example, be the same as, include, or otherwise correspond to a second top surface area of the wafer that is cleaned by the solution nozzle (110 of FIG. 1A). In some embodiments, an outline of the second spray area 110a is the same as that of the second top surface area. The second spray area 110a overlaps with the undamaged edge portion 102u of the wafer 102 and may border the first spray area 104a. In some embodiments, the second spray area 110a shares an edge with the new sidewall of the wafer 102 and/or overlaps with the first spray area 104a. In other embodiments, the second spray area 110a does not overlap with the first spray area 104a.

In some embodiments, the air jet nozzle (112 of FIG. 1A) has a third spray area 112a and is configured to apply the pressurized gas to the wafer 102 at the third spray area 112a. The third spray area 112a moves with the blade apparatus (104 of FIG. 1A) and may be the same as, include, or otherwise correspond to a third top surface area of the undamaged edge portion 102u the wafer 102. In some embodiments, an outline of the third spray area 112a is the same as that of the third top surface area. Further, in some embodiments, the third spray area 112a overlaps with and is larger than the first spray area 104a and the second spray area 110a. Thus, in some embodiments, the third spray area 112a directly overlies portions of both the undamaged edge portion 102u and the damaged edge portion 102d.

Therefore, the spray and/or shower nozzles (126, 128 of FIG. 1A), the solution nozzle (110 of FIG. 1A), and the air jet nozzle (112 of FIG. 1A) of the wafer trimming and cleaning apparatus of FIG. 1A effectively remove contaminant particles generated by the blade (124 of FIG. 1A) from the first spray area 104a, the second spray area 110a, and the third spray area 112a of the wafer, respectively, while removing the damaged edge portion 102d of the wafer 102 to produce a reliable wafer.

Figure 2A:
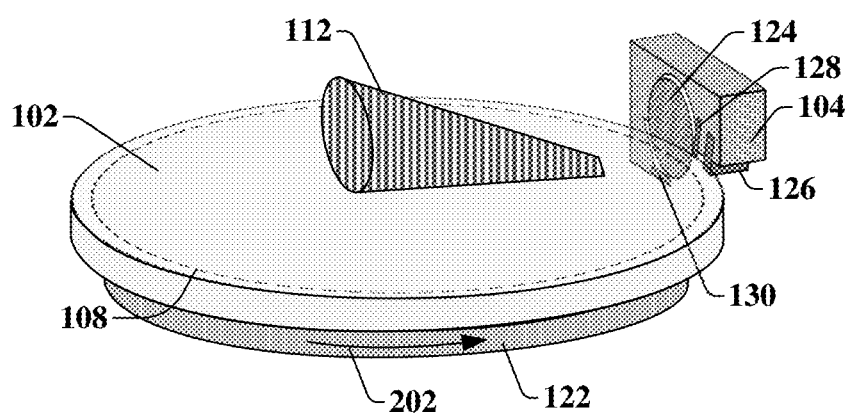
FIGS. 2A, 2B, and 2C illustrate a perspective view, a cross-sectional view, and a top-view, respectively, of a wafer trimming and cleaning apparatus comprising an air jet nozzle.

FIG. 2A illustrates a perspective view 200A of some alternative embodiments of a wafer trimming and cleaning apparatus.

The wafer trimming and cleaning apparatus in the perspective view 200A of FIG. 2A includes the same features as in the perspective view 100A of FIG. 1A, except without the solution nozzle (110 of FIG. 1A). In some embodiments, the air jet nozzle 112 effectively removes contaminant particles generated by the blade 124 that were not removed by the spray nozzle 126 and/or the shower nozzle 128. The air jet nozzle 112 also utilizes pressurized gas to push any remaining contaminant particles and deionized water from the spray nozzle 126, the shower nozzle 128, and the blade cooler nozzle 130 off of the wafer 102. Without the solution nozzle (110 of FIG. 1A), less materials (e.g., the cleaning solution) are used and thus, less waste (e.g., the cleaning solution) is produced.

In some embodiments, the wafer chuck 122 is configured to rotate 202 while the blade apparatus 104 and the air jet nozzle 112 remain fixed such that the wafer 102 moves towards the blade 124 for trimming. In other embodiments (not shown), the wafer chuck 122 may be configured to be fixed while the blade apparatus 104 and the air jet nozzle 112 move along the trim path 108. In some embodiments, the wafer chuck 122 may be configured to rotate 202 at a speed of, for example, approximately 1 degree per second, in order to prevent the wafer 102 from breaking upon trimming.

Figure 2B:
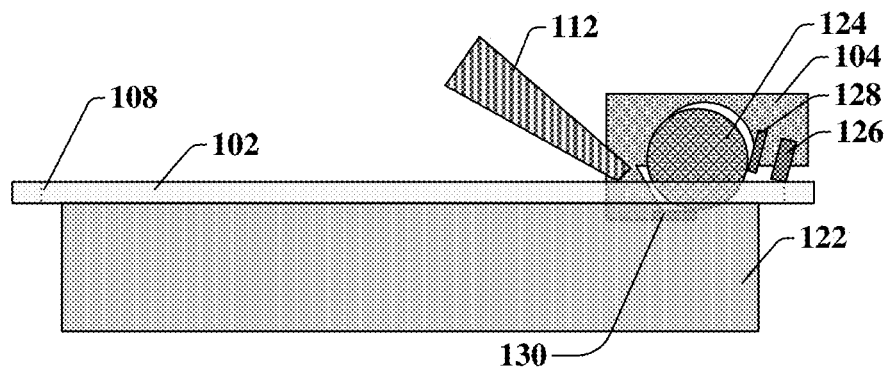

FIG. 2B illustrates a cross-sectional view 200B of some embodiments of the wafer trimming and cleaning apparatus of FIG. 2A. Thus, the wafer trimming and cleaning apparatus of the cross-sectional view 200B includes the same features as the cross-sectional view 100B of FIG. 1B, except without the solution nozzle (110 of FIG. 1B).

Figure 2C:
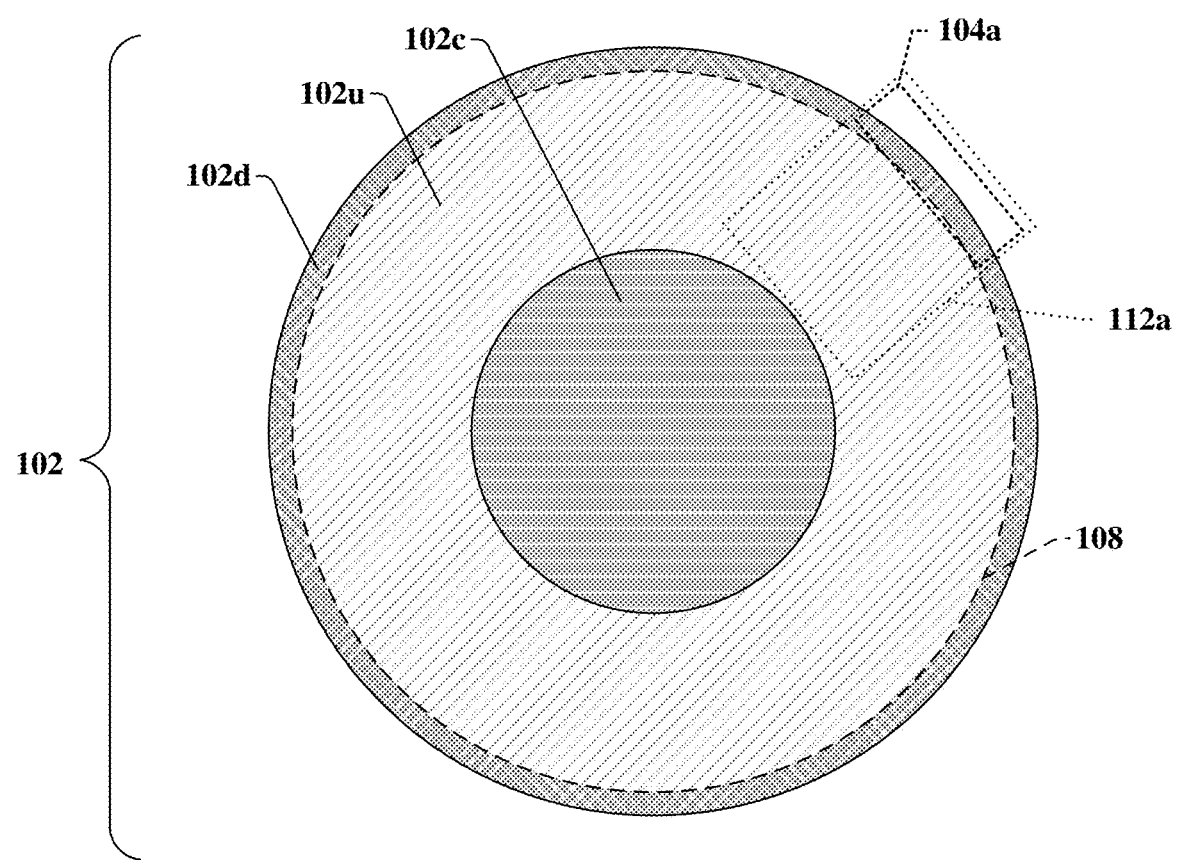

FIG. 2C illustrates a top-view 200C of some embodiments of a wafer having a damaged edge portion corresponding to the perspective view of FIG. 2A. Thus, the top-view 100C of FIG. 2C illustrates the same features of the top-view 100C of FIG. 1C, except without the second spray area (110a of FIG. 1C) because the solution nozzle (110 of FIG. 1A) is not included in the embodiment of the wafer trimming and cleaning apparatus in FIGS. 2A-2C. Nevertheless, in some embodiments, the third spray area 112a overlaps the first spray area 104a. The first spray area 104a overlies the damaged edge portion 102d and also a partially overlies the new sidewall. As such, the blade apparatus (104 of FIG. 2A) is configured to remove the damaged edge portion 102d and also remove contaminant particles from the new sidewall of the wafer 102 by applying deionized water. In some embodiments, the air jet nozzle (112 of FIG. 2A) is configured to apply the pressurized gas that is directed towards the third spray area 112a of the wafer 102. The third spray area 112a includes the first spray area 104a. Thus, the air jet nozzle (112 of FIG. 2A) further cleans a larger portion of the wafer than the blade apparatus to ensure the complete, or near complete, removal of contaminant particles generated by the blade apparatus (104 of FIG. 2A) during the removal of the damaged edge portion 102d.

Figure 3:
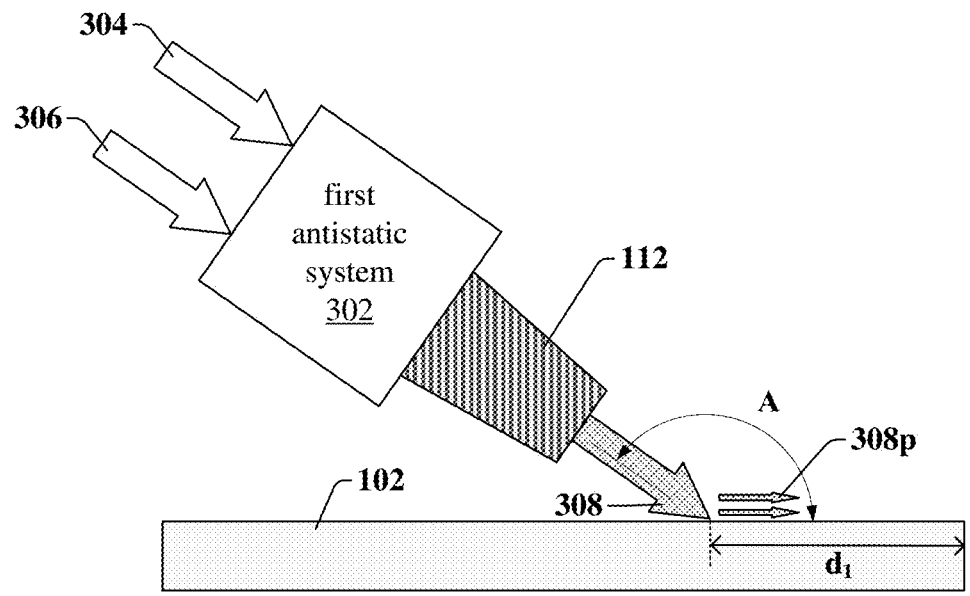
FIG. 3 illustrates a cross-sectional view of an air jet nozzle comprising a first antistatic system.

FIG. 3 illustrates a cross-sectional view 300 of some embodiments of an air jet nozzle.

The air jet nozzle 112 and the wafer 102 of FIG. 3 may correspond to some embodiments of the air jet nozzle 112 and the wafer 102 illustrated in FIGS. 1A and 2A. In some embodiments, a first antistatic system 302 is coupled to the air jet nozzle 112. In some embodiments, the first antistatic system 302 may comprise a first input line 304 and a second input line 306. The first antistatic system 302 may be configured to process a first gas from the first input line 304 and a second gas from the second input line 306 to produce a pressurized gas 308 that is not electrically charged. When the pressurized gas 308 is not electrically charged (e.g., the pressurized gas 308 is neutral), the pressurized gas 308 can effectively remove contaminant particles without the interference of electrical interactions. In some embodiments, the pressurized gas 308 may be directed towards the wafer 102 at a first angle A and generate a planar pressurized gas flow 308p to force off any contaminant particles and/or liquid solutions for cleaning from the wafer 102. The first angle A is greater than 90 degrees such that the planar pressurized gas flow 308p directs contaminant particles and/or liquid solutions away from a center of the wafer 102 and towards the edge of the wafer 102 by using a planar flow. Thus, in some embodiments, the first angle A may be an obtuse angle. In some embodiments, the air jet nozzle 112 is directed towards the wafer 102 such that the pressurized gas 308 first contacts the wafer 102 at a first distance $d_1$ from an edge of the wafer 102.

In some embodiments, the first input line 304 receives a propellant, which may be a liquid, and the second input line 306 receives liquid or gas carbon dioxide. In such embodiments, the pressurized gas 308 may include a mixture of carbon dioxide gas and carbon dioxide solid particles. For example, in some embodiments, the propellant may enter the first antistatic system 302 through the first input line 304 and may be expelled from the first antistatic system 302 and the air jet nozzle 112 while carrying the liquid or gas carbon dioxide. As such, the propellant propels the liquid or gas carbon dioxide onto the wafer 102. The different states of the carbon dioxide in the pressurized gas 308 dislodge contaminant particles and push the dislodged contaminant particles off of the wafer 102. This process may be known as carbon dioxide snow cleaning. Thus, in some embodiments, the pressurized gas 308 may also include a mixture of gas and liquid. In other embodiments, the pressurized gas 308 may include only gases. In some embodiments, only the first input line 304 is needed because only one gas is used as the pressurized gas 308. In other embodiments, more than two input lines are coupled to the air jet nozzle 112. In some embodiments, the air jet nozzle 112 is directly coupled to the first input line 304 without the first antistatic system 302.

Figure 4:
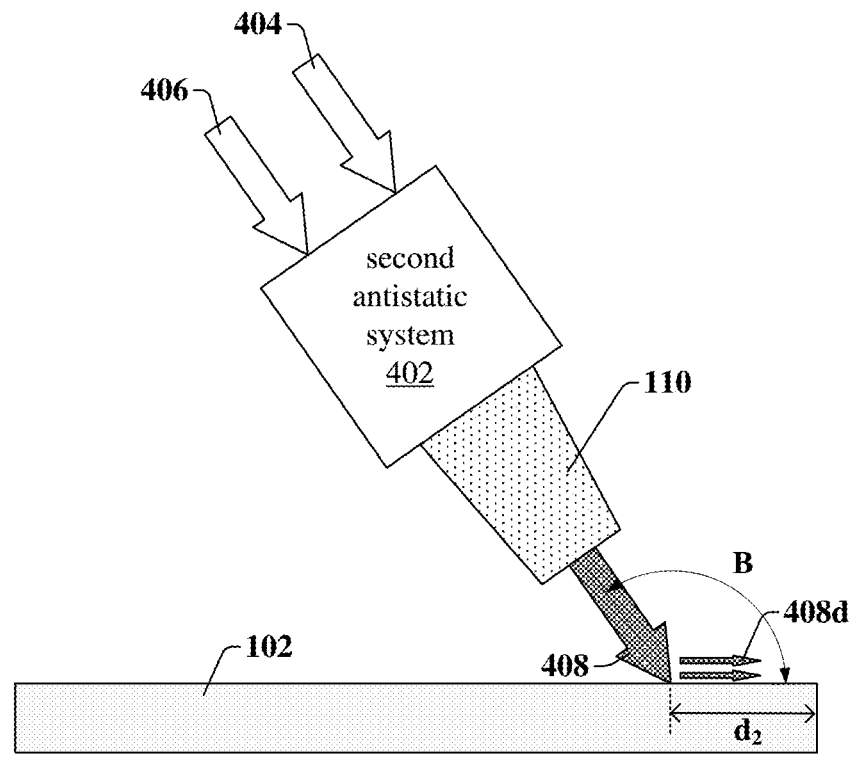
FIG. 4 illustrates a cross-sectional view of a solution nozzle comprising a second antistatic system.

FIG. 4 illustrates a cross-sectional view 400 of some embodiments of a solution nozzle.

The solution nozzle 110 and the wafer 102 of FIG. 4 may correspond to some embodiments of the solution nozzle 110 and the wafer 102 illustrated in FIGS. 1A and 2A. In some embodiments, the second antistatic system 402 is coupled to the solution nozzle 110. In some embodiments, the second antistatic system 402 may comprise a third input line 404 and a fourth input line 406. In some embodiments, the second antistatic system 402 may be configured to: 1) receive a gas from the third input line 404 and a liquid from the fourth input line 406, process the gas and the liquid; and 2) produce a cleaning solution 408 that is not electrically charged and comprises the gas distributed in the liquid. The cleaning solution 408 can effectively remove contaminant particles without the interference of electrical interactions.

The cleaning solution 408 may be directed towards the wafer at a second angle B by the solution nozzle 110. The second angle B is greater than 90 degrees such that when the cleaning solution 408 hits the wafer 102, the directed cleaning solution 408d then directs contaminant particles and/or liquid solutions away from a center of the wafer 102 and towards the edge of the wafer 102. Thus, in some embodiments, the second angle B may be an obtuse angle. In some embodiments, the solution nozzle 110 is configured such that the cleaning solution 408 first contacts the wafer 102 at a second distance $d_2$ from an edge of the wafer 102.

In some embodiments, the cleaning solution 408 may comprise nanobubbles dispersed in a liquid solution. Thus, the liquid solution, such as deionized water, may enter the second antistatic system 402 through the third input line 404, and a gas, such as carbon dioxide, may enter the second antistatic system 402 through the fourth input line 406. In other embodiments, the cleaning solution 408 may comprise a surfactant. In some embodiments, for example, the cleaning solution 408 may be a hydrocarbon surfactant. In some embodiments, the solution nozzle 110 is directly coupled to the third input line 404 without the second antistatic system 402 and the fourth input line 406. In some embodiments, only the third input line 404 is coupled to the solution nozzle 110, whereas in other embodiments, more than two input lines may be coupled to the solution nozzle 110. In other embodiments, the cleaning solution 408 may comprise: 1) dilute hydrofluoric acid having a volume concentration in the range of between approximately 0.1 percent and approximately 2 percent; 2) ozonated water; 3) an SC1 cleaning having 40 parts water, 1 part hydrogen peroxide, and 1 part ammonia hydroxide; or 4) a combination thereof.

Figure 5:
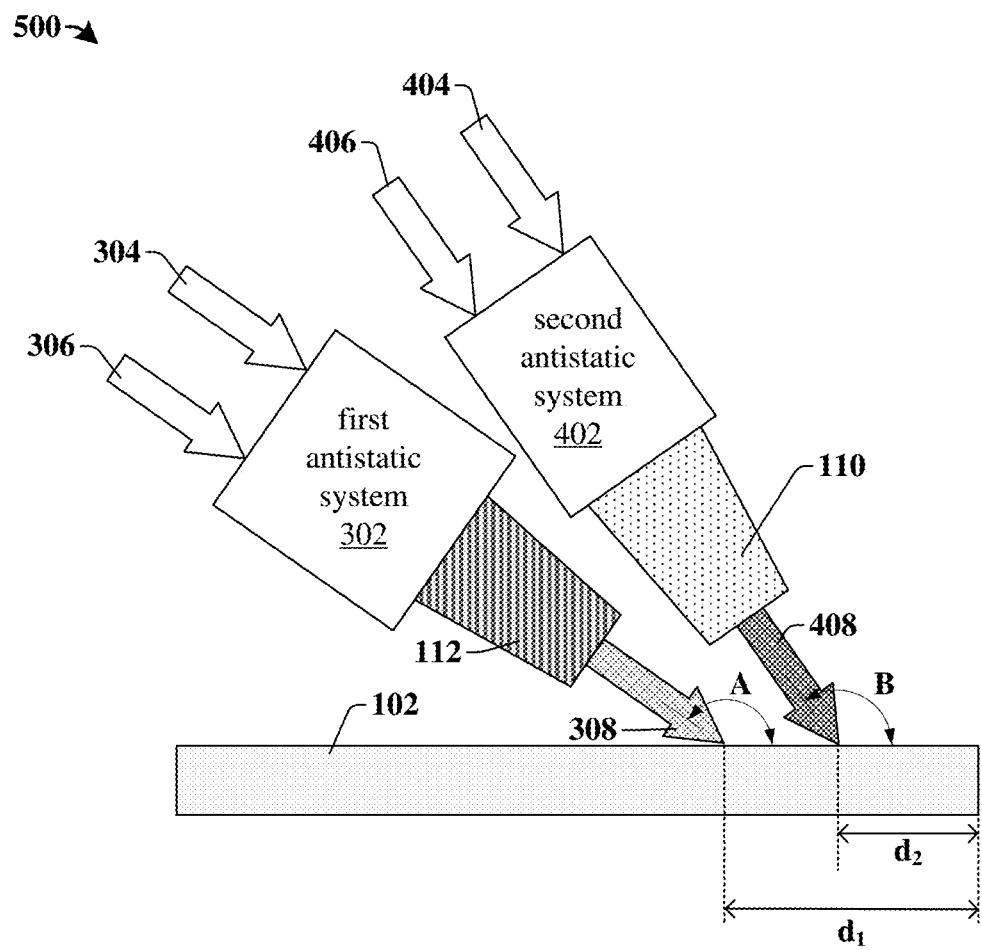
FIG. 5 illustrates a cross-sectional view of a solution nozzle and an air jet nozzle configured to clean a wafer.

FIG. 5 illustrates a cross-sectional view 500 of some embodiments of a wafer cleaning apparatus comprising an air jet nozzle and a cleaning solution.

The wafer cleaning apparatus includes the solution 110 of FIG. 4 and the air jet nozzle 112 of FIG. 3 configured to clean the wafer 102. The air jet nozzle 112 and the solution nozzle 110 are arranged to direct the pressurized gas 308 and the cleaning solution 408 towards a same edge of the wafer 102 to effectively remove contaminant particles away from a center of the wafer 102 and towards the same edge of the wafer 102. In some embodiments, the solution nozzle 110 and the air jet nozzle 112 are separate and distinct from one another. Thus, in some embodiments, the solution nozzle 110 and the air jet nozzle 112 may be controlled separately from one another. In some embodiments, the first distance $d_1$ is greater than the second distance $d_2$. In some embodiments, the solution nozzle 110 is configured to apply the cleaning solution 408 during a first time period, and the air jet nozzle 112 is configured to apply the pressurized gas 308 during a second time period. In some embodiments, the first time period is before and does not overlap the second time period. The pressurized gas 308 then removes any contaminant particles and remaining cleaning solution 408 on the wafer 102. In some embodiments, the first time period is before and at least partially overlaps the second time period. In other embodiments, the first time period and the second time period are the same. In some embodiments, the first angle A may be greater than the second angle B. In other embodiments (not shown), the first angle A may be less than or equal to the second angle B. Nevertheless, both the first angle A and the second angle B are greater than 90 degrees in order to direct contaminant particles away from a center of the wafer and towards the edge of the wafer.

FIGS. 6A, 6B, 7A, 7B, 8A, and 8B illustrate cross-sectional views and top-views 600A, 600B, 700A, 700B, 800A, and 800B of some embodiments of a method for trimming and cleaning a wafer having a damaged edge portion. Although FIGS. 6A, 6B, 7A, 7B, 8A, and 8B are described in relation to a method, it will be appreciated that the structures disclosed in FIGS. 6A, 6B, 7A, 7B, 8A, and 8B are not limited to such a method, but instead may stand alone as structures independent of the method.

Figure 6A:
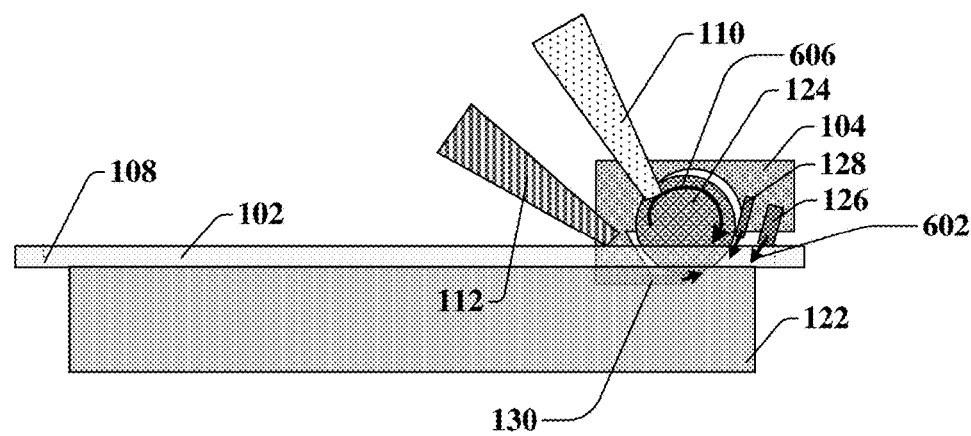
FIGS. 6A, 6B, 7A, 7B, 8A, and 8B illustrate cross-sectional views and top-views of some embodiments of a method of trimming and cleaning a wafer using a blade apparatus, a solution nozzle, and an air jet nozzle.

As shown in the cross-sectional view 600A of FIG. 6A, the blade apparatus 104 is turned on, such that the blade 124 is rotating 606 to trim the wafer 102 and such that the blade cooler nozzle 130, the spray nozzle 126, and the shower nozzle 128 are all applying deionized water 602 to remove contaminant particles. Deionized water may be used to remove contaminant particles without the interference of electrical interactions. The embodiment in the cross-sectional view 600A of FIG. 6A has the same features as the perspective view 100A of FIG. 1A. In some embodiments, the blade 124 rotates 606 and the blade cooler nozzle 130, the spray nozzle 126, and the shower nozzle 128 apply deionized water 602 during a first time period. In some embodiments, the blade 124 rotates 606 as the wafer chuck 122 continuously rotates while the blade apparatus 104, the solution nozzle 110 and the air jet nozzle 112 are fixed, such that the blade 124 continuously trims the wafer 102 along the trim path 108. In some embodiments, the trim path 108 defines a circumference of the wafer 102 after trimming. In other embodiments, it is the blade apparatus 104, the solution nozzle 110 and the air jet nozzle 112 that continuously rotate while the wafer chuck 122 is fixed such that the blade 124 continuously trims the wafer 102 along the trim path 108.

Figure 6B:
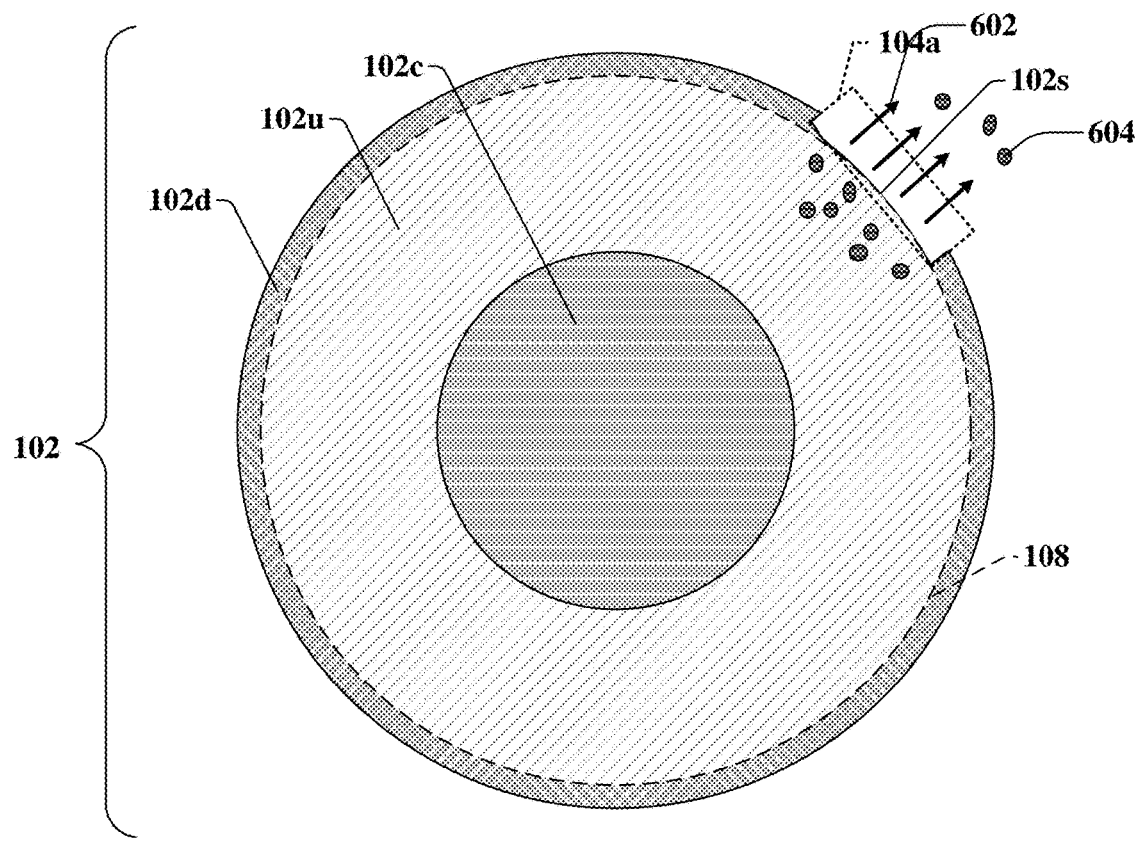

The top-view 600B of FIG. 6B corresponds to the cross-sectional view 600A of FIG. 6A. As shown in the top-view 600B of FIG. 6B, the wafer 102 has a damaged edge portion 102d surrounding an undamaged edge portion 102u and a central portion 102c of the wafer 102, similar to the features of the wafer 102 in the top-view 100C of FIG. 1C and to the wafer 102 in the top-view 200C of FIG. 2C. In the top-view 600B, the blade (124 of FIG. 6A) has partially trimmed off the damaged edge portion 102d of the wafer 102 along the trim path 108 during the first time period. Further, the spray nozzle (126 of FIG. 6A), the shower nozzle (128 of FIG. 6A), and the blade cooler nozzle (130 of FIG. 6A) have applied deionized water 602 to the wafer 102 at first spray area 104a to remove contaminant particles 604. The first spray area 104a overlaps with a new sidewall 102s of the wafer 102 defined by the blade (124 of FIG. 6A) during the first time period. Contaminant particles 604 may accumulate on the new sidewall 102s of the wafer 102. Further, the first spray area 104a may overlap with a first top surface area to remove any contaminant particles 604 on the undamaged edge portion 102u of the wafer 102 in the first spray area 104a. However, in some embodiments, the spray nozzle (126 of FIG. 6A), the shower nozzle (128 of FIG. 6A), and the blade cooler nozzle (130 of FIG. 6A) do not direct the contaminant particles 604 away from the central portion 102c of the wafer 102. Instead, while some of the contaminant particles 604 may be removed from the new sidewall 102s and the undamaged edge portion 102u of the wafer 102, other contaminant particles 604 may be left behind on the undamaged edge portion 102u of the wafer that are outside of the first spray area 104a.

Figure 7A:
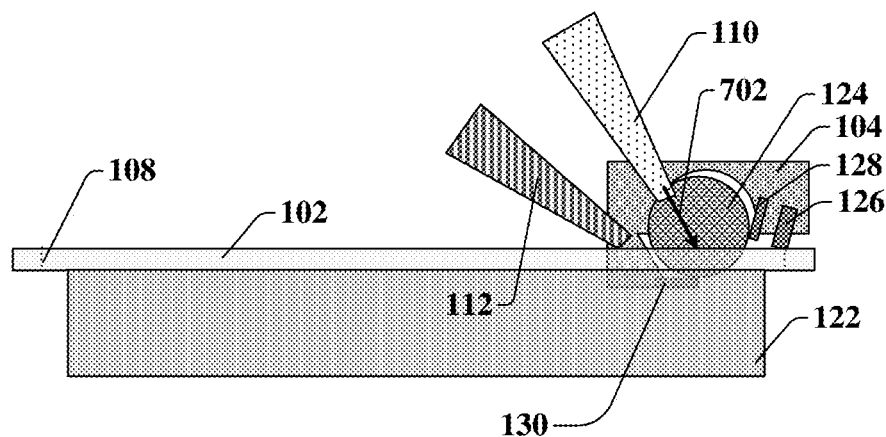

As shown in the cross-sectional view 700A of FIG. 7A, the solution nozzle 110 applies a cleaning solution 702 to the wafer 102 during a second time period. The solution nozzle 110 is configured to apply the cleaning solution 702 at a second angle (B of FIG. 4) to dislodge and remove the contaminant particles (604 of FIG. 6A) on the wafer 102, as well as any remaining deionized water on the wafer 102.

Figure 7B:
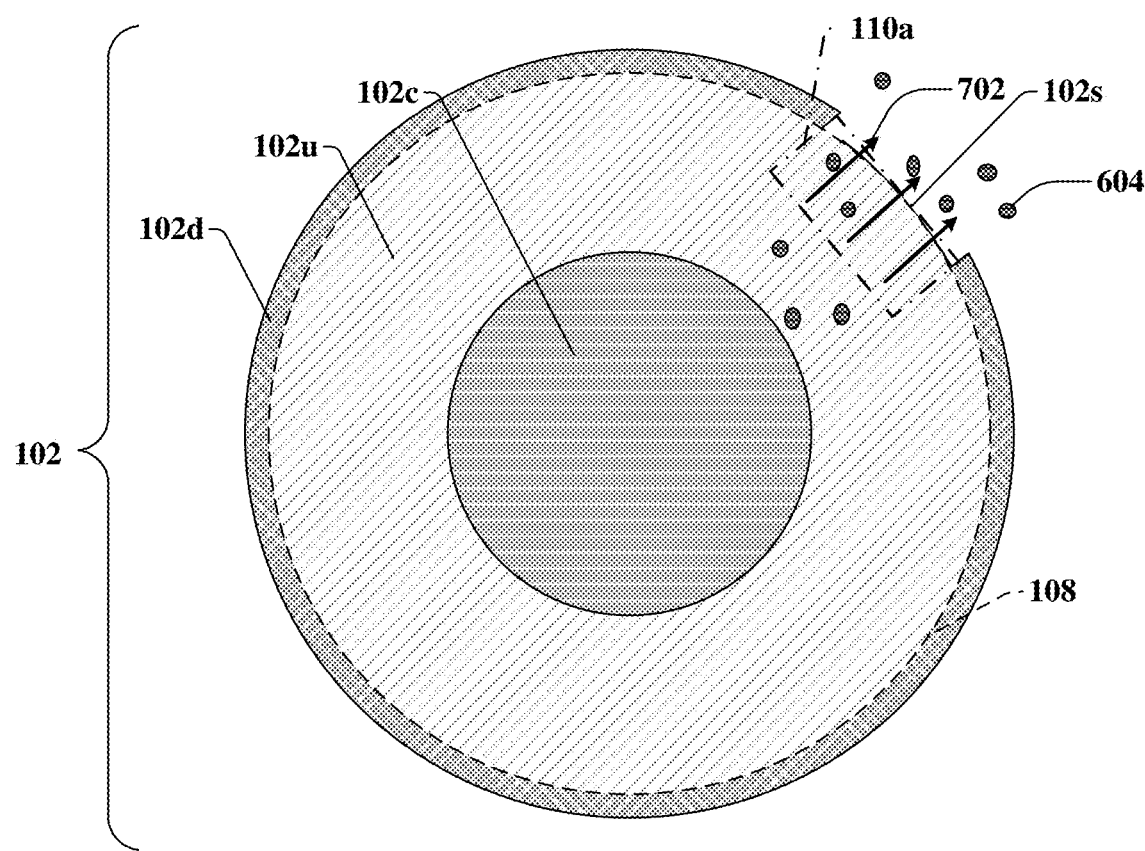

The top-view 700B of FIG. 7B corresponds to the cross-sectional view 700A of FIG. 7A. As shown in the top-view 700B of FIG. 7B, the cleaning solution is applied 702 to dislodge and remove the contaminant particles 604 of FIG. 6B in a second spray area 110a that partially overlaps the first spray area (104a of FIG. 6B). The application of the cleaning solution 702 pushes the contaminant particles 604 and deionized water away from the central portion 102c of the wafer 102 and towards the new sidewall 102s of the wafer 102 for removal. However, in some embodiments, some of the contaminant particles 604 may still be left on a top surface of the wafer 102 within the second spray area 110a. Further, in some embodiments, some of the contaminant particles 604 may be left on a top surface of the wafer 102 that is outside of the second spray area 110a.

Figure 8A:
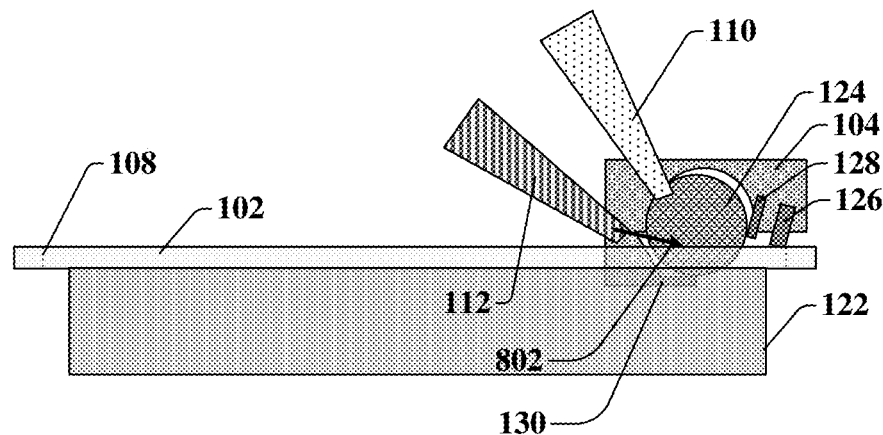

As shown in the cross-sectional view 800A of FIG. 8A, the air jet nozzle 112 applies a pressurized gas 802 to the wafer 102 during a third time period. The air jet nozzle 112 is configured to apply the pressurized gas 802 at a first angle (A of FIG. 3) to dislodge and remove the contaminant particles (604 of FIG. 7A) on the wafer 102 generated by the blade 124 during the first time period; any remaining deionized water on the wafer 102 generated by the the spray nozzle 126, the shower nozzle 128, and the blade cooler nozzle 130 during the first time period; and any remaining cleaning solution on the wafer 102 generated by the solution nozzle 110 during the second time period.

Figure 8B:
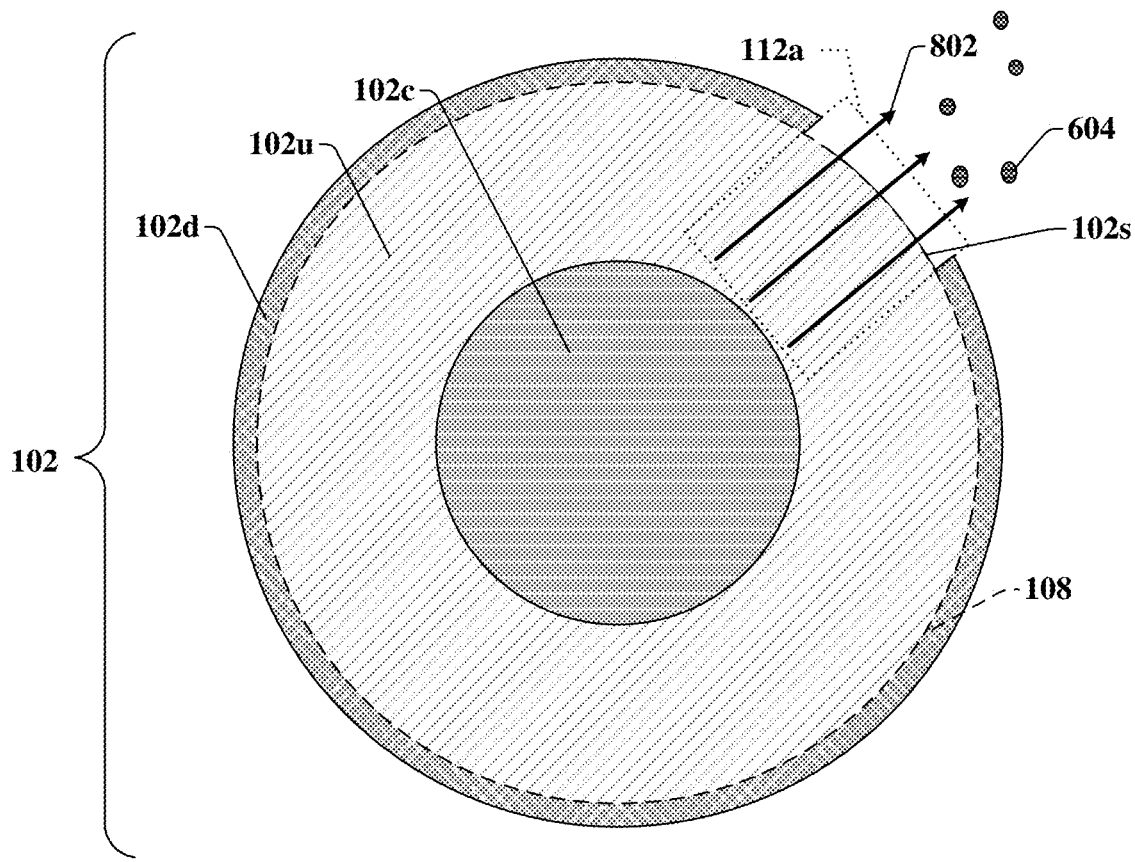

The top-view 800B of FIG. 8B corresponds to the cross-sectional view 800A of FIG. 8A. As shown in the top-view 800B of FIG. 8B, the pressurized gas is applied 802 to the wafer 102 to dislodge and remove the contaminant particles 604 of FIG. 7B at a third spray area 112a. The third spray area 112a includes and is larger than the first spray area (104a of FIG. 6B) and the second spray area (110a of FIG. 7B). The application of the pressurized gas 802 pushes the contaminant particles 604 and any remaining deionized water and/or cleaning solution away from the central portion 102c of the wafer 102 and towards the new sidewall 102s of the wafer 102 for removal. Thus, the application of the cleaning solution (702 of FIG. 7B) on the wafer 102 at the second spray area (110a of FIG. 7B), and the application of the pressurized gas 802 on the wafer 102 at the third spray area 112a effectively remove contaminant particles off of top surfaces of the wafer 102.

It will be appreciated that in some embodiments of a wafer trimming and cleaning apparatus, the solution nozzle (110 of FIG. 8A) is not present, as in the embodiment in FIGS. 2A, 2B and 2C. Thus, in such embodiments, a method for trimming and cleaning a wafer having a damaged edge portion does not include FIGS. 7A and 7B; instead, FIG. 8A proceeds from FIG. 6B. Further, it will be appreciated that in some embodiments, the air jet nozzle (112 of FIG. 6A) may comprise a first antistatic system (302 of FIG. 3), and/or the solution nozzle (110 of FIG. 6A) may comprise a second antistatic system (402 of FIG. 4) through the embodiments in FIGS. 6A, 7A, and 8A.

In some embodiments, the first time period, the second time period, and the third time period may completely overlap with one another. For example, in such embodiments, the wafer (102 of FIG. 6A) is continuously trimmed by the blade (124 of FIG. 6A) as the wafer chuck (114 of FIG. 1A) continuously rotates. While the blade (124 of FIG. 6A) continuously trims the wafer (102 of FIG. 6A), the water nozzles (126, 128, 130 of FIG. 6A), the solution nozzle (110 of FIG. 7A), and the air jet nozzle (112 of FIG. 8A) are continuously on to remove contaminant particles (604 of FIG. 6A). Thus, the cleaning of the wafer (102 of FIG. 6A) occurs while the blade (124 of FIG. 6A) is trimming the wafer (102 of FIG. 6A), such that the addition of the solution nozzle (110 of FIG. 7A) and the air jet nozzle (112 of FIG. 8A) do not add time to the wafer trimming process.

In other embodiments, the first time period may overlap with the second time period and the third time period, but the second time period may not overlap with the third time period. For example, in such other embodiments, the blade (124 of FIG. 6A) may continuously trim the wafer (102 of FIG. 6A) while the water nozzles (126, 128, 130 of FIG. 6A) continuously apply deionized water in the first spray area (104a of FIG. 6B) as the wafer chuck (114 of FIG. 6A) rotates (202 of FIG. 2A). While the trimming and the applying of the deionized water occur, the solution nozzle (110 of FIG. 7A) and the air jet nozzle (112 of FIG. 8A) may clean the wafer (102 of FIG. 6A) in an alternating cycle. For example, the solution nozzle (110 of FIG. 7A) may be turned on to apply the cleaning solution to the second spray area (110a of FIG. 7B) while the air jet nozzle (112 of FIG. 8A) is off. Then, after the solution nozzle (110 of FIG. 7A) is turned off, the air jet nozzle (112 of FIG. 8A) may be turned on to apply the pressurized gas to the third spray area (112a of FIG. 8B). This may repeat as the trimming and the applying of the deionized water proceeds.

In yet other embodiments, the second time period may completely overlap with the first time period, the third time period may completely overlap with the first time period, and the second time period may only partially overlap with the third time period. For example, in such embodiments, the blade (124 of FIG. 6A) may continuously trim the wafer (102 of FIG. 6A) while the water nozzles (126, 128, 130 of FIG. 6A) continuously apply deionized water in the first spray area (104a of FIG. 6B) as the wafer chuck (114 of FIG. 6A) rotates (202 of FIG. 2A). While the trimming and the applying of the deionized water occur, the solution nozzle (110 of FIG. 7A) and the air jet nozzle (112 of FIG. 8A) may cyclically clean the wafer (102 of FIG. 6A). For example, the solution nozzle (110 of FIG. 7A) may be turned on to apply the cleaning solution to the second spray area (110a of FIG. 7B). Then, as the solution nozzle (110 of FIG. 7A) is turning off, the air jet nozzle (112 of FIG. 8A) may be turned on to apply the pressurized gas to the third spray area (112a of FIG. 8B). Then, as the air jet nozzle (112 of FIG. 8A) is turning off, the solution nozzle (110 of FIG. 7A) may be turned back on. This may repeat as the trimming and the applying of the deionized water proceeds.

Nevertheless, the blade (124 of FIG. 8A) continuously trims the damaged edge portion 102d along the trim path 108 to define a new sidewall 102s on an undamaged edge portion 102u of the wafer. As the blade (124 of FIG. 8A) continuously trims, the steps to remove contaminant particles 604 as illustrated in FIGS. 6A, 6B, 7A, 7B, 8A, and 8B are performed in-situ, or in the same chamber, with the blade trimming, providing and effective method to remove contaminant particles 604 from a wafer 102 without increasing production time.

Figure 9:
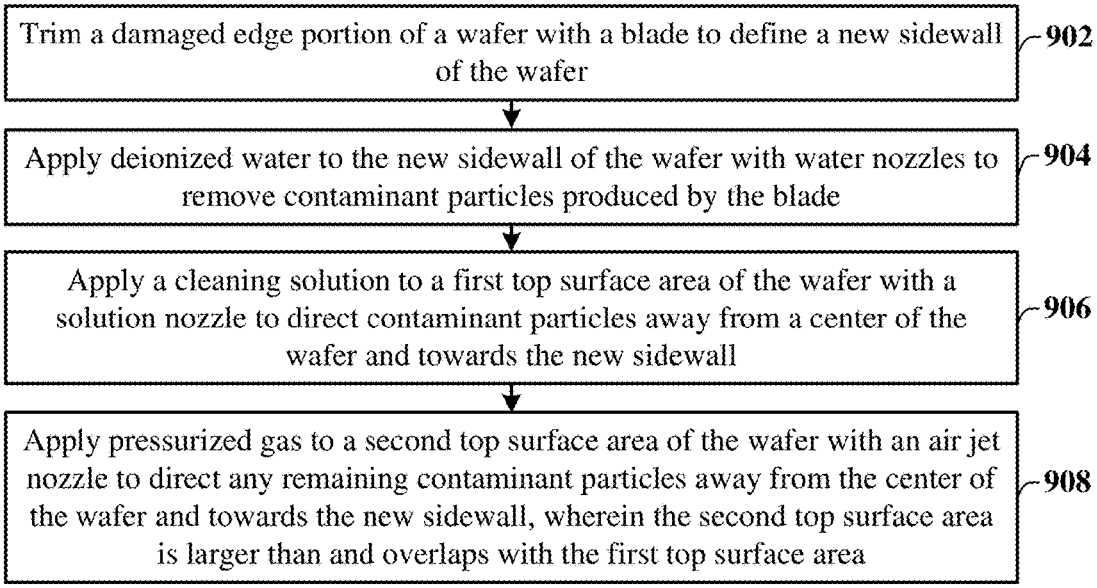
FIG. 9 illustrates a flow diagram of some embodiments of the method illustrated in FIGS. 6A, 6B, 7A, 7B, 8A, and 8B.

FIG. 9 illustrates a flow diagram of some embodiments of a method 900 for trimming and cleaning a wafer having a damaged edge portion, as illustrated in FIGS. 6A, 6B, 7A, 7B, 8A, and 8B.

While method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902, a damaged edge portion of a wafer is trimmed with a blade to define a new sidewall of the wafer.

At 904, deionized water is applied to the new sidewall of the wafer with water nozzles to remove contaminant particles produced by the blade. FIGS. 6A and 6B illustrate a cross-sectional view 600A and a top-view 600B, respectively, of some embodiments corresponding to acts 902 and 904.

At 906, a cleaning solution is applied to a first top surface area of the wafer with a solution nozzle to direct contaminant particles away from a center of the wafer towards the new sidewall. FIGS. 7A and 7B illustrate a cross-sectional view 700A and a top-view 700B, respectively, of some embodiments corresponding to act 906.

At 908, pressurized gas is applied to a second top surface area of the wafer with a solution nozzle to direct contaminant particles away from the center of the wafer and towards the new sidewall, wherein the second top surface area is larger than and overlaps with the first top surface area. FIGS.

8A and 8B illustrate a cross-sectional view 800A and a top-view 800B, respectively, of some embodiments corresponding to act 908.

Therefore, the present disclosure relates to a new wafer trimming and cleaning apparatus and corresponding method to remove a damaged edge portion of wafer and to effectively remove any corresponding contaminant particles by utilizing multiple cleaning nozzles having different particle removal techniques.

Accordingly, in some embodiments, the present disclosure relates to a wafer trimming and cleaning apparatus, comprising: a blade configured to trim a damaged edge portion of a wafer and to define a new sidewall of the wafer; water nozzles configured to apply deionized water to the new sidewall of the wafer to remove contaminant particles generated by the blade; and an air jet nozzle configured to apply pressurized gas to a first top surface area of the wafer to remove the contaminant particles generated by the blade, wherein the first top surface area overlies the new sidewall of the wafer.

In other embodiments, the present disclosure relates to a wafer trimming and cleaning apparatus, comprising: a blade configured to remove a damaged edge portion of a wafer but not an undamaged edge portion of the wafer, wherein removal of the damaged edge portion by the blade defines a new sidewall of the wafer; a wafer chuck configured to support the wafer; water nozzles having a first spray area configured to overlap and clean the new sidewall of the wafer at the blade; a solution nozzle having a second spray area configured to overlap and clean the undamaged edge portion of the wafer at the blade, wherein the second spray area borders the first spray area; and an air jet nozzle directed outward away from a center of the wafer chuck and having a third spray area configured to overlap the undamaged edge portion of the wafer at the blade, wherein the third spray area is larger than and includes the second spray area.

In yet other embodiments, the present disclosure relates to a method for trimming and cleaning an edge of a wafer, the method comprising: trimming a damaged edge portion of the wafer with a blade to define a new sidewall of the wafer, wherein trimming produces contaminant particles on the wafer; applying deionized water to the new sidewall of the wafer with water nozzles to remove the contaminant particles; and applying pressurized gas to the wafer at a first top surface area of the wafer with an air jet nozzle, wherein the pressurized gas is directed outward from a center of the wafer to remove remaining contaminant particles, and wherein the applying of deionized water and the applying of pressurized gas are performed in a same chamber as the trimming.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for trimming and cleaning an edge of a wafer, the method comprising:
trimming an outer edge portion of the wafer with a blade along a continuously connected trim path to define a new sidewall of the wafer, wherein trimming produces contaminant particles on the wafer;
applying deionized water to the new sidewall of the wafer with water nozzles to remove the contaminant particles; and
applying pressurized gas to the wafer at a first top surface area of the wafer with an air jet nozzle, wherein the pressurized gas is directed outward from a center of the wafer to remove remaining contaminant particles, and wherein the applying of the deionized water and the applying of the pressurized gas are performed in a same chamber as the trimming.

2. The method of claim 1, wherein the first top surface area of the wafer overlies the new sidewall of the wafer, and wherein the pressurized gas is applied at an obtuse angle with the first top surface area of the wafer to force the contaminant particles away from the center of the wafer and towards the blade for removal.

3. The method of claim 1, wherein the wafer includes multiple layers of different materials.

4. The method of claim 1, wherein the trimming and the applying of the deionized water are performed at a first time, and wherein the applying of the pressurized gas is performed at a second time after the first time.

5. The method of claim 1, further comprising:
applying a cleaning solution to a second top surface area of the wafer with a solution nozzle to remove remaining contaminant particles, wherein the second top surface area of the wafer shares an edge with the new sidewall, wherein the first top surface area includes and is larger than the second top surface area, and wherein the applying of the cleaning solution is performed in the same chamber as the trimming.

6. The method of claim 5, wherein the applying of the cleaning solution is performed between the applying of the deionized water and the applying of the pressurized gas.

7. The method of claim 5, wherein the applying of the deionized water, the applying of the cleaning solution, and the applying of the pressurized gas are performed simultaneously.

8. A method comprising:
removing an outer edge portion of a wafer along a continuously connected trim path using a blade, wherein the trim path separates the outer edge portion of the wafer from an inner edge portion of the wafer, wherein the removal of the outer edge portion by the blade defines a new sidewall of the wafer, and wherein the new sidewall of the wafer is based on the trim path;
applying water to a first spray area of the wafer with water nozzles to clean the new sidewall of the wafer, wherein the first spray area overlaps with the new sidewall of the wafer at the blade;
applying a cleaning solution to a second spray area of the wafer with a solution nozzle to clean the inner edge portion of the wafer, wherein the second spray area overlaps with the inner edge portion of the wafer at the blade, and wherein the second spray area borders the first spray area; and
applying pressurized gas to a third spray area of the wafer with an air jet nozzle, wherein the pressurized gas is directed outward away from a center of the wafer, and wherein the third spray area is larger than and includes the second spray area.

9. The method of claim 8, further comprising:
loading the wafer onto a wafer chuck; and rotating the wafer chuck during the removing and the applying of the water, the cleaning solution, and the pressurized gas.

10. The method of claim 8, wherein the applying of the water is performed during a first time period, wherein the applying of the cleaning solution is performed during a second time period, wherein the applying of the pressurized gas is performed during a third time period, and wherein the first, second, and third time periods overlap with one another.

11. The method of claim 8, wherein the applying of the water, the applying of the cleaning solution, and the applying of the pressurized gas are performed simultaneously.

12. The method of claim 8, wherein the removing, the applying of the water, the applying of the cleaning solution, and the applying of the pressurized gas are performed in-situ.

13. The method of claim 8, wherein the pressurized gas is applied at a first obtuse angle with a top surface of the wafer, wherein the cleaning solution is applied at a second obtuse angle with the top surface of the wafer, and wherein the second obtuse angle is less than the first obtuse angle.

14. The method of claim 8, wherein a first antistatic system is coupled to the air jet nozzle such that the pressurized gas is uncharged.

15. The method of claim 8, further comprising:
distributing nanobubbles in the cleaning solution prior to applying the cleaning solution.

16. A method comprising:
trimming an outer edge portion of a wafer using a blade to define a new sidewall of the wafer;
applying deionized water to the new sidewall of the wafer using water nozzles to remove contaminant particles generated by the trimming;
applying pressurized gas to a top surface of the wafer and away from a center of the wafer with an air jet nozzle to remove the contaminant particles generated by the trimming; and
applying a cleaning solution to the top surface of the wafer and away from the center of the wafer to remove the contaminant particles generated by the trimming.

17. The method of claim 16, wherein the blade and the water nozzles are coupled to a blade apparatus.

18. The method of claim 16, further comprising:
applying deionized water to the blade using the water nozzles to reduce a temperature of the blade.

19. The method of claim 16, wherein the pressurized gas is applied at a first obtuse angle with the top surface of the wafer, wherein the cleaning solution is applied at a second obtuse angle with the top surface of the wafer, and wherein the second obtuse angle is less than the first obtuse angle.

20. The method of claim 16, the trimming, the applying of the deionized water, the applying of the cleaning solution, and the applying of the pressurized gas are performed simultaneously.

* * * * *